United States Patent
OuYang et al.

(10) Patent No.: US 6,535,443 B1
(45) Date of Patent: Mar. 18, 2003

(54) REDUCTION OF STANDBY CURRENT

(75) Inventors: Paul H. OuYang, San Jose, CA (US); Donald Liusie, San Jose, CA (US)

(73) Assignee: DMEL Incorporated, Santa Clara, CA (US)

( * ) Notice: Subject to any disclaimer, the term of this patent is extended or adjusted under 35 U.S.C. 154(b) by 0 days.

(21) Appl. No.: 10/171,907

(22) Filed: Jun. 13, 2002

(51) Int. Cl.$^7$ ................................................ G11C 7/00
(52) U.S. Cl. ........................ 365/207; 365/204; 365/208
(58) Field of Search ................................ 365/207, 206, 365/208, 204

(56) References Cited

U.S. PATENT DOCUMENTS

| | | | | |
|---|---|---|---|---|
| 4,751,681 A | * | 6/1988 | Hashimoto | 365/207 |
| 5,297,092 A | * | 3/1994 | Johnson | 365/203 |
| 5,973,957 A | * | 10/1999 | Tedrow | 365/207 |
| 5,982,690 A | * | 11/1999 | Austin | 365/205 |
| 6,204,698 B1 | * | 2/2000 | Zhang | 327/57 |

* cited by examiner

*Primary Examiner*—Son T. Dinh
(74) *Attorney, Agent, or Firm*—Skjerven Morrill LLP

(57) ABSTRACT

The rate of discharge of the sense amplifier and bit lines in a memory circuit is controlled to simulate a boosted sense ground potential without requiring the use of a voltage regulator or precharged capacitors. The sense amplifier is electrically coupled to ground through a large transistor during a first period, which quickly discharges the sense amplifier toward ground potential to ensure a fast sense speed of the sense amplifier. During a subsequent period, the large transistor is turned off and the sense amplifier is electrically coupled to ground through a smaller transistor. The small transistor slowly discharges the sense amplifier towards ground, without reaching ground, until the active cycle is over and the discharge of the sense amplifier is terminated. By holding the sense amplifier above, but near, ground potential, the subthreshold leakage of non-selected memory cells is minimized so that the frequency of refresh may be decreased, thereby minimizing standby current.

11 Claims, 5 Drawing Sheets

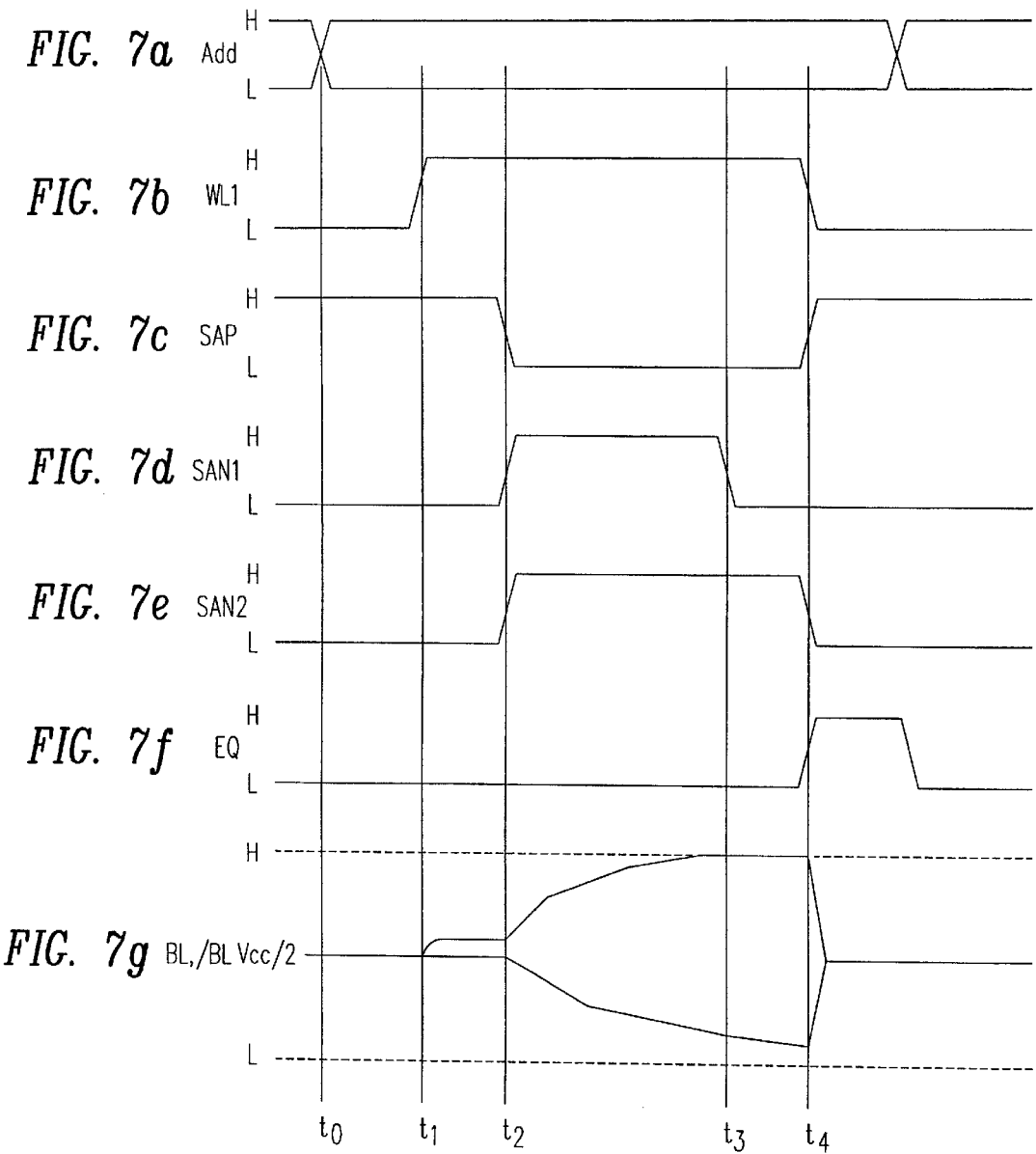

REDUCTION OF STANDBY CURRENT

FIELD OF THE INVENTION

The present invention relates to the reduction of standby power in a memory system that, e.g., includes dynamic random access memory (DRAM) or pseudo-static random access memory (pseudo SRAM). In particular, the present invention relates to reducing standby current by reducing the subthreshold leakage in the transistor in the memory cell by controlling the rate of discharge of the sense amplifier.

BACKGROUND

Electronic devices such as PDAs or wireless mobile or cellular phones, are driven by a battery power supply and use DRAM or pseudo-SRAM as data memory. One of the problems with a conventional DRAM or pseudo-SRAM schemes is data-retention. The data (voltage) stored in the memory cell decays with time, which requires that the memory cell be refreshed at predetermined intervals.

One source of data decay is subthreshold leakage current in the transistor in the memory cell. FIG. 1 shows a typical unselected memory cell 10 including transistor 12 and capacitor 14. In the worst case situation for data retention, memory cell 10 is connected to a bit line (BL) 16, which is at a LOW potential, capacitor 14 is storing a HIGH data (voltage) and the word line (WL) 18 is LOW, i.e., transistor 12 is turned off. Thus, the source voltage, i.e., bit line 16, is at the same LOW voltage as the gate voltage, i.e., word line 18, which causes a subthreshold leakage current, shown as broken arrow 20. The subthreshold leakage current causes the HIGH data in capacitor 14 to decay. Another source of data decay is the junction leakage current, shown as broken arrow 22, caused by the source voltage being at the same LOW voltage as the substrate voltage.

The standby power consumption of DRAM or pseudo-SRAM devices is directly proportional the memory size and the frequency of the refresh operation. Thus, as the need for higher density DRAM or pseudo-SRAM increases in battery powered device, it is desirable to reduce the frequency of refresh to minimize standby power consumption. A proposed method of reducing the frequency of refresh is known as a boosted sense-ground scheme. The boosted sense ground scheme decreases the subthreshold leakage by boosting the LOW on bit line 16 to a boosted sense ground voltage ($V_{bsg}$), thereby creating a negative gate-source voltage ($V_{gs}$) and a negative source-substrate ($V_{bs}$) voltage. Negative gate-source voltage ($V_{gs}$) and negative source-substrate ($V_{bs}$) exponentially decreases the subthreshold leakage current and the junction leakage current in transistor 12. With the decrease in leakage current, the data-retention time of the memory cell is extended, which consequently permits a decrease in the frequency of refresh. Unfortunately, raising the source voltage to $V_{bsg}$ is difficult.

One known method of implementing the boosted sense ground scheme is shown as circuit 30 in FIG. 2, and is discussed in detail in Asakura et al., in IEEE Journal of Solid-State Circuits, Vol. 29, No. 11, November. 1994, pages 1303–1307, which is incorporated herein by reference. As shown in FIG. 2, circuit 30 includes a differential amplifier 32 and a reference voltage generator 34 to raise the voltage on the bit line to the desired boosted sense ground voltage ($V_{bsg}$). FIG. 3 shows the simulated wave forms of both a conventional bit-line pair 36 and the boosted sense ground ($_{bsg}$) pair 38 splitting as data is being read. FIG. 3 shows that the bsg pair 38 senses the 1V bit line swing 1.2 ns faster than the conventional pair 36. Unfortunately, while the use of a differential amplifier 32 and reference voltage generator 34 is effective, it is not efficient as it draws too much power. Thus, in a battery powered device, circuit 30 is undesirable due to the increase in power consumption caused by the reference voltage generator 34 and differential amplifier 32.

Another known method of implementing the boosted sense ground scheme is shown as circuit 50 in FIG. 4 and is known as a precharged-capacitor-assisted sensing scheme, which is discussed in more detail in Kono, et a., in IEEE Journal of Solid-State Circuits, Vol. 35, No. 8, August. 2000, pages 1179–1185, which is incorporated herein by reference. With the precharged-capacitor-assisted sensing scheme, a level controller 51 and decoupling capacitors 52 and 54 are used to discharge the bit lines 53 and 55 until the data level of the bit lines is at the desired voltage $V_{bsg}$. FIG. 5 shows the simulated wave forms of both a conventional $_{bsg}$ scheme pair 58 and the precharged-capacitor-assisted sensing scheme pair 60 splitting as data is being read. The use of decoupling capacitors 52 and 54 and level controller 51 requires power for each charge and discharge and is, therefore, undesirable for battery powered devices.

Accordingly, what is needed is a memory circuit that produce a boosted sense ground potential to reduce subthreshold leakage to minimize standby current, without requiring additional power consumption to achieve the boosted sense ground potential.

SUMMARY

A memory circuit, in accordance with the present invention, includes a sense amplifier that generates a boosted sense ground potential by controlling the rate of discharge of the sense amplifier towards ground without holding the sense amplifier at a constant voltage level. Thus, the memory circuit does not require a boosted sense ground voltage regulator or precharged capacitors, but nevertheless, minimizes the subthreshold leakage found in unselected memory cells. Consequently, the frequency of refresh can be decreased to reduce standby current.

The memory circuit includes a plurality of bit lines, word lines and memory cells disposed between the bit lines and word lines. The memory circuit also includes a sense amplifier for reading data from a selected memory cell. The sense amplifier is electrically coupled to ground potential through at least two transistors, a large transistor and a small transistor. A control circuit is used to control when the large transistor and small transistor are turned on and off. The control circuit turns the large transistor on to discharge the sense amplifier toward ground quickly, which ensures a fast sense speed for the sense amplifier. In one embodiment, both the large and small transistors are turned on to quickly discharge the sense amplifier toward ground potential. The large transistor is turned off after a short period so that the sense amplifier is coupled to ground only through the small transistor. The small transistor continues to discharge the sense amplifier toward ground but at a much slower rate than the large transistor. The small transistor is turned off prior to the sense amplifier reaching ground potential. Consequently, the sense amplifier provides a decreasing boosted sense ground potential to the bit line without the use of a boosted sense ground voltage generator.

Another aspect of the present invention is a method of controlling a memory circuit that includes a sense amplifier including discharging the sense amplifier towards ground at a first rate, and discharging the sense amplifier towards ground at a second rate that is slower than the first rate, and terminating the discharge of the sense amplifier towards ground prior to the sense amplifier reaching ground. The different discharge rates ensures that the sense amplifier will achieve a fast sense speed, as well as hold a boosted sense ground potential without the use of a voltage regulator or precharged capacitors.

BRIEF DESCRIPTION OF THE DRAWINGS

FIGS. 7(a) through 7(g) are timing diagrams describing the operation of the memory circuit of FIG. 6.

DETAILED DESCRIPTION

Figure 6:
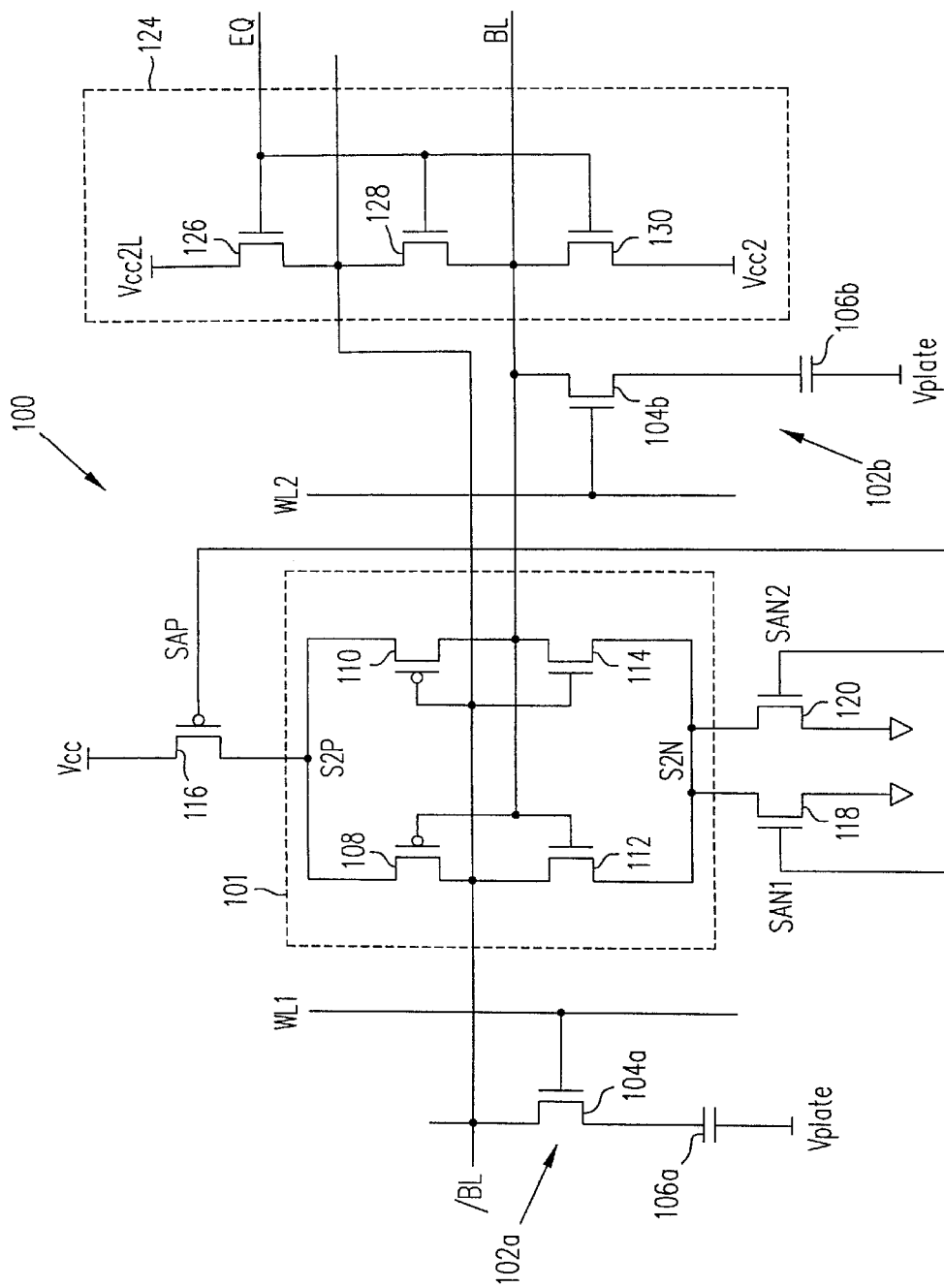
FIG. 6 is a circuit diagram of a memory circuit, in accordance with an embodiment of the present invention, which controls the rate of discharge of the sense amplifier.

FIG. 6 is a circuit diagram of a memory circuit 100 in accordance with an embodiment of the present invention. As shown in FIG. 6, memory circuit 100 includes sense amplifier 101 coupled to two bit lines BL and /BL and respective memory cells 102a and 102b. It should be understood that sense amplifier 101 may be coupled to a conventional memory array, including multiple memory cells (not shown), but only memory cells 102a and 102b are shown for the sake of simplicity. In accordance with the present invention, memory circuit 100 controls the rate of discharge of sense amplifier 101 towards ground to provide a boosted sense ground potential to sense amplifier 101 without the use of a voltage generator or discharge capacitors during refresh mode. Consequently, the frequency of refresh of memory circuit 100 may be decreased, thereby reducing the standby current, without requiring additional power consumption.

Each memory cell 102a and 102b includes an N channel MOS transistor 104a, and 104b and a capacitor 106a and 106b for storing data. The gate electrodes of transistors 104a and 104b are coupled to word lines WL1 and WL2, respectively, and the source electrodes are coupled to bit lines /BL and BL, respectively. The drain electrodes of transistors 104a and 104b are coupled to respective capacitors 106a and 106b. The capacitors 106a and 106b are also coupled to $V_{plate}$, which is approximately one-half of Vcc.

Sense amplifier 101 includes N channel MOS transistors 108 and 110 coupled between bit lines BL and /BL and P channel MOS transistors 112 and 114, which are also coupled between bit lines BL and /BL. The gate electrodes of transistors 110 and 114 are coupled to bit line /BL and the gate electrodes of transistors 108 and 112 are coupled to bit line BL. The source electrodes of transistors 108 and 110 are coupled to a P channel MOS transistor 116 that acts as a positive sense amplifier drive transistor. The source electrode of transistor 116 is coupled to a voltage source Vdd, while the gate electrode of transistor 116 is coupled to a sense amplifier driver line SAP. The source electrodes of transistors 112 and 114 are coupled to two N channel MOS transistors 118 and 120, which act as negative sense amplifier drive transistors. The source electrodes of transistors 118 and 120 are coupled to ground. The gate electrodes of transistors 118 and 120 are respectively coupled to sense amplifier drive lines SAN1 and SAN2, which independently control transistors 118 and 120. Sense amplifier drive lines SAP, SAN1 and SAN2 are controlled by a timing control circuit 122.

Thus, sense amplifier 101 acts as a differential amplifier coupled between a HIGH voltage source Vdd via drive transistor 116 and a LOW voltage source via two drive transistors 118 and 120. Drive transistors 118 and 120, in accordance with an embodiment of the present invention, have different widths. For example, where sense amplifier 101 is coupled to thirty-two memory cells, the drive transistors 118 and 120 may have widths of 0.32 $\mu$ and 0.10 $\mu$, respectively, while drive transistor 116 may have a width of, e.g., 0.64 $\mu$. Because the large drive transistor 118 is much larger than the small drive transistor 120, large drive transistor 118 draws more current that small drive transistor 120.

A precharge circuit 124 is coupled to bit lines BL and /BL. As shown in FIG. 6, precharge circuit 124 includes an N channel MOS transistor 126 coupled between /BL and Vcc2L, a second N channel MOS transistor 128 coupled between bit lines BL and /BL, and a third N channel MOS transistor 130 coupled between bit line BL and Vcc2, where Vcc2L is approximately the same potential as Vcc and Vcc2 is approximately the same potential as ground. Precharge circuit 124 is controlled by an equalization signal EQ that is received at the gates of transistors 126, 128, and 130.

Operation of sense amplifier 101 will be described with reference timing diagrams FIGS. 7(a) through 7(g).

As shown in FIG. 7(a), a new address signal is strobed at time $t_0$. Bit lines BL and /BL are precharged to a value Vcc/2. After a short delay, e.g., 5 $\mu$s, word line WL1 transitions from LOW (L) to HIGH (H) at time $t_1$ turning transistor 104a on. Thus, the charge on capacitor 106a is read onto bit line /BL. When the data in memory cell 102a is HIGH, the potential on bit line /BL rises above the precharge potential Vcc/2, as shown in FIG. 7(g). Consequently, a potential difference between bit lines /BL and BL is applied to sense amplifier 101.

At time $t_2$, approximately 4 $\mu$s after time $t_1$, the sense amplifier drive line SAP transitions LOW (L) rendering transistor 116 conductive, thereby supplying voltage Vcc to sense amplifier 101, shown in FIG. 7(c). Sense amplifier drive lines SAN1 and SAN2 transition HIGH (H) rendering respective transistors 118 and 120 conductive, shown in FIGS. 7(d) and 7(e). Consequently, the charge on sense amplifier 101 flows to ground through transistors 118 and 120. With bit line /BL slightly above the precharge potential Vcc/2, transistor 114 is rendered more conductive and, thus, the charge on bit line BL decreases toward ground, as shown in FIG. 7(g). In addition, because bit line BL is coupled to the gate electrodes of transistors 108 and 112, transistor 108 is rendered conductive causing bit line /BL to rise towards power supply potential Vcc, as shown in FIG. 7(g). Because transistor 116 is large, e.g., 0.64 $\mu$, bit line /BL is driven toward the power supply potential Vcc quickly.

Advantageously, because sense amplifier 101 is coupled to ground through two transistors 118 and 120, the rate of discharge of bit line BL towards ground may be controlled, e.g., by turning on and off the large drive transistor 118. Thus, in accordance with an embodiment of the present invention, the large drive transistor 118 is pulsed on for a period, e.g., 5 µs to 9 µs, that is less than the full period that the bit lines are split. After a delay from transitioning HIGH (H) at time $t_2$, sense amplifier drive line SAN1 transitions LOW (L), as shown in FIG. 7(d), thereby turning off large transistor 118. Sense amplifier drive line SAN2, on the other hand, remains HIGH (H) and, thus, small transistor 120 remains conductive for approximately, e.g., 2 µs to 4 µs. Consequently, as shown in FIG. 7(g), between times $t_2$ and $t_3$, during which both large transistor 118 and small transistor 120 are conductive, bit line BL is rapidly driven towards ground. By quickly driving sense amplifier 101 toward ground during the time period between times $t_2$ and $t_3$, sense amplifier 101 will have a fast sense speed. After time $t_3$, however, when only small transistor 120 is on, the rate of discharge of bit line BL is decreased.

After the potential on bit lines BL and /BL are provided to appropriate input/output circuitry (not shown), word line WL1 and sense amplifier drive lines SAP and SAN2 transition at time $t_4$ to turn off respective transistors 104a, 116, and 120, shown in FIGS. 7(b), 7(c), and 7(e). A precharge circuit 124 receives an equalize signal EQ (shown in FIG. 7(f)), which causes bit lines BL and /BL to be precharged back to Vcc/2, as shown in FIG. 7(g).

Thus, as shown in FIG. 7(g), between times $t_2$ and $t_3$, sense amplifier 101 quickly discharges towards ground to ensure a fast sense speed. Between times $t_3$ and $t_4$, however, the rate of discharge decreases to ensure that sense amplifier 101 is held near, but above, ground potential. At time $t_4$, the discharge of sense amplifier 101 is terminated, when small transistor 120 is turned off, prior to sense amplifier 101 reaching ground potential. Thus, in one example, where Vcc is 1.8V, and bit lines BL and /BL are precharged to 0.9V, sense amplifier 101 and bit line BL may be discharged to 0.3V during the period between times $t_2$ and $t_3$, e.g., 7 µs, and further discharged from 0.3V to 0.2V during the period between times $t_3$ and $t_4$, which is, e.g., 4 µs. In one embodiment, the discharge rate during the period between times $t_3$ and $t_4$ is approximately one-third of the discharge rate during the period between times $t_2$ and $t_3$. After time $t_4$ the bit lines BL and /BL are precharged back to 0.9V. Accordingly, with the use of a large transistor 118 and a small transistor 120 and control over the duration of the conductive periods of transistors 118 and 120, the voltage level on bit line BL may be maintained above ground so as to minimize leakage in the unselected memory cell 102b.

Figure 1:
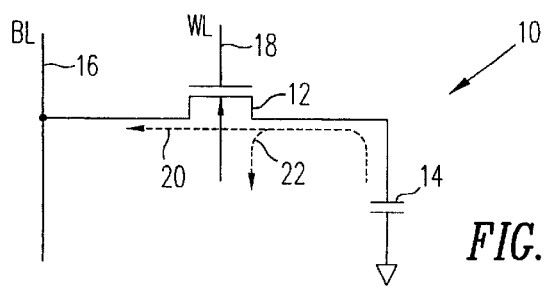
FIG. 1 shows a typical unselected memory cell including a transistor and a capacitor.
Figure 2:
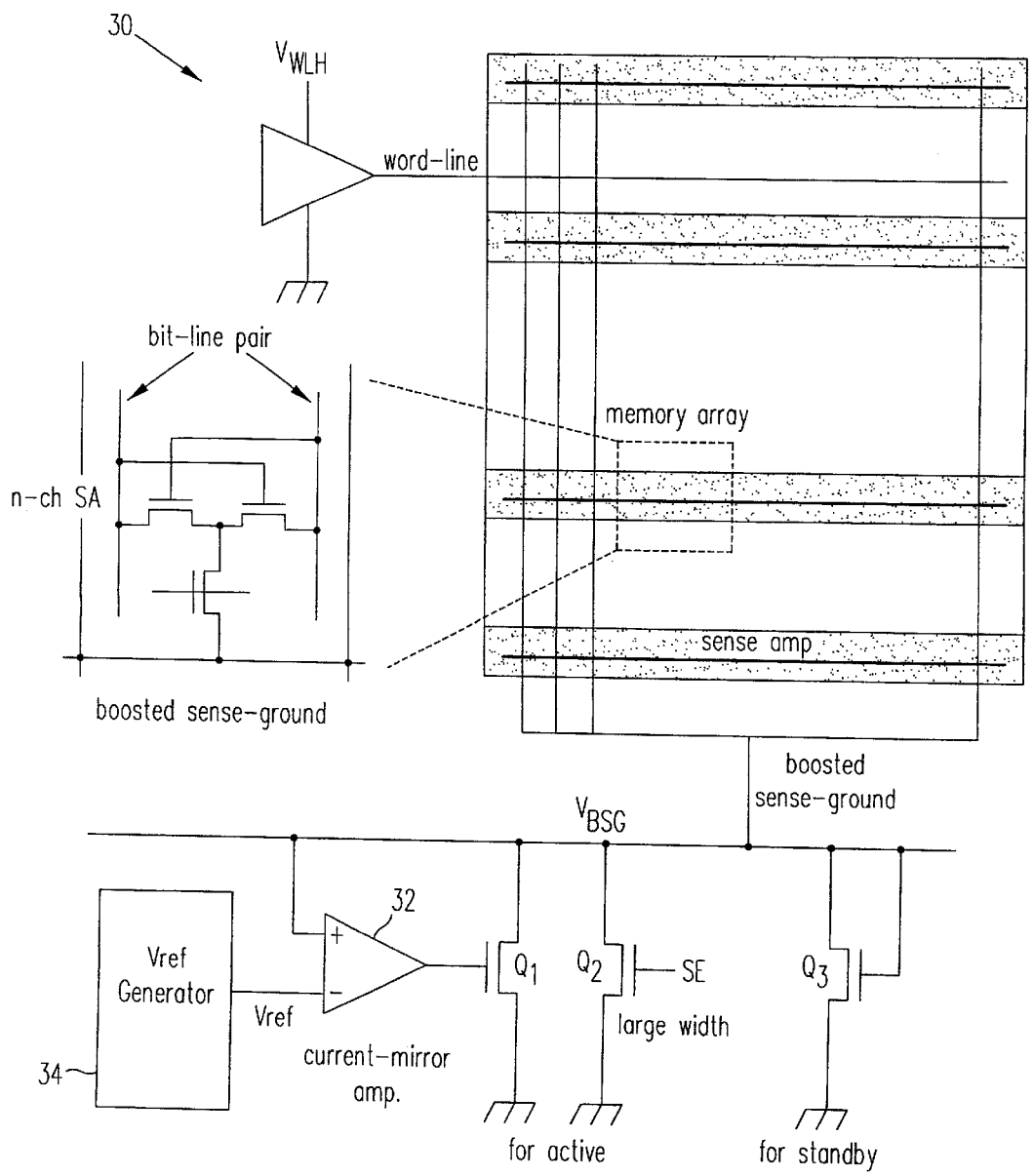
FIG. 2 shows a memory circuit implementing a conventional boosted sense ground scheme using a reference voltage generator.
Figure 3:
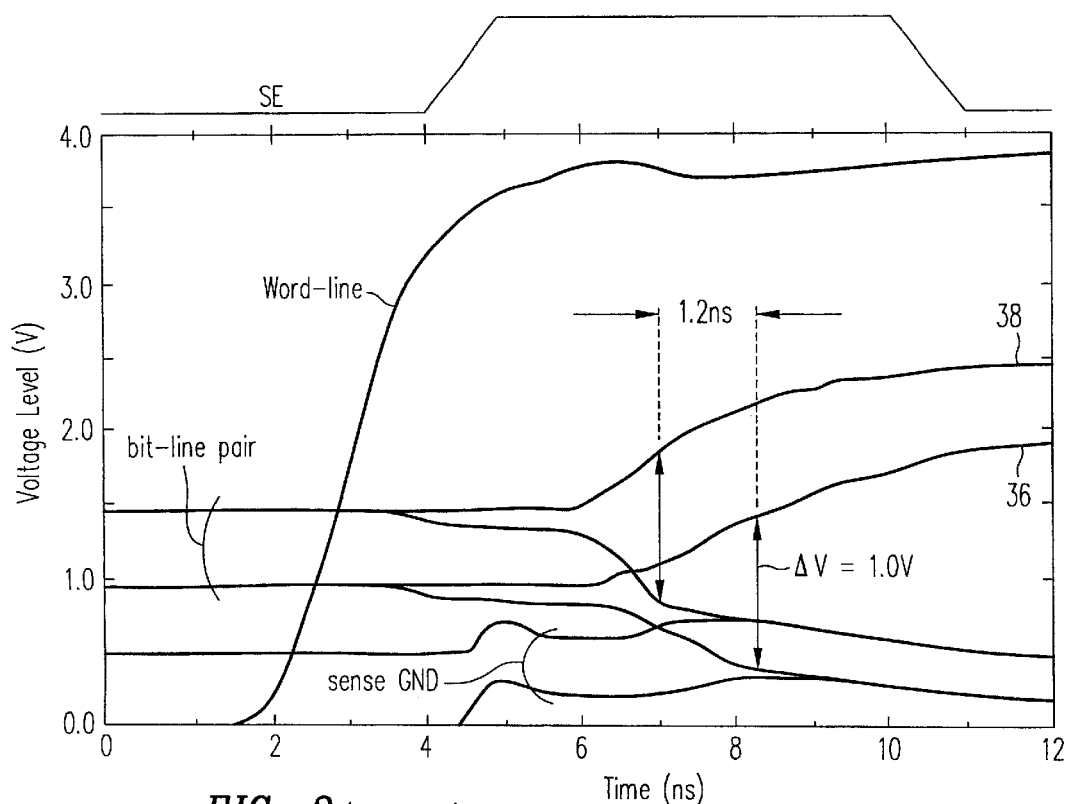
FIG. 3 shows the simulated waveform for the boosted sense ground scheme.
Figure 5:
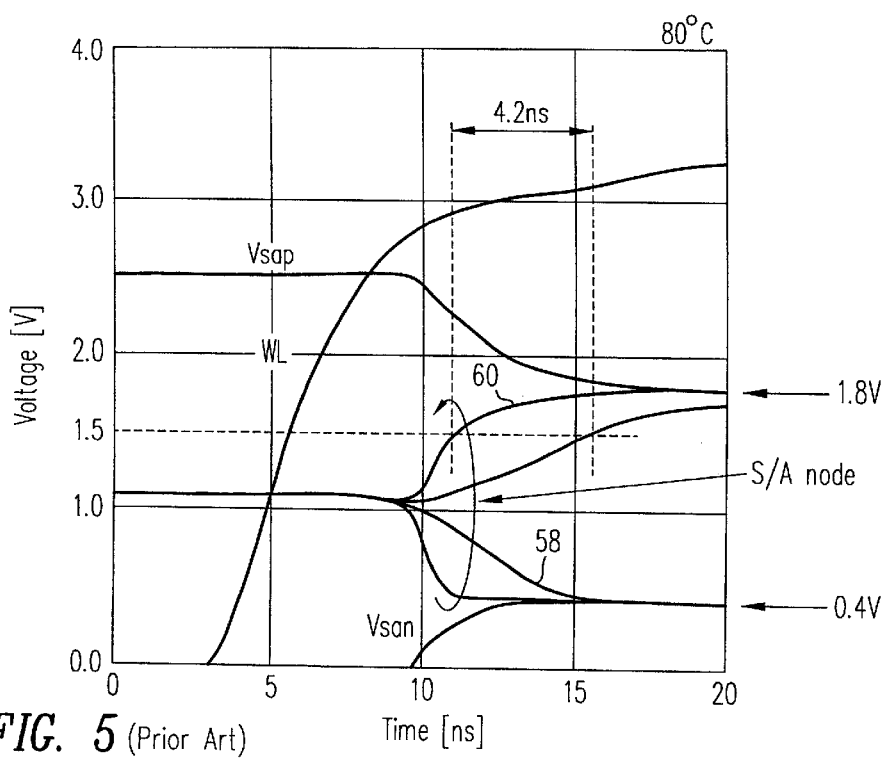
FIG. 5 shows the simulated waveform of for the precharged-capacitor-assisted sensing scheme pair of FIG. 4.
Figure 4:
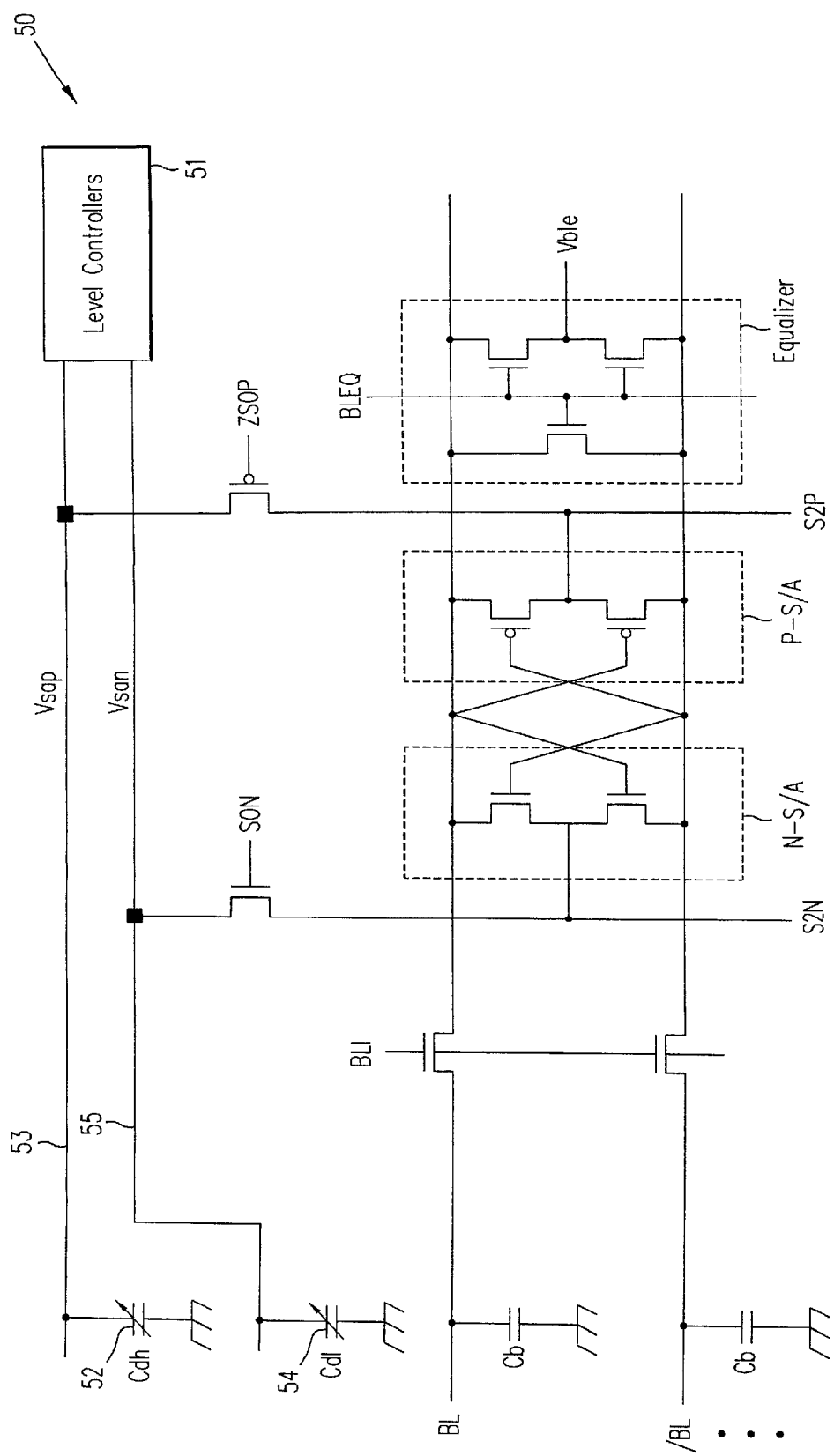
FIG. 4 shows a memory circuit implementing another conventional boosted sense ground scheme using precharged-capacitors.

If sense amplifier 101 and bit line BL were discharged to ground, and if the charge in unselected memory cell 102b were HIGH, an unacceptable amount of leakage would occur in transistor 104b, as discussed in reference to FIG. 1. By preventing sense amplifier 101 and bit line BL from reaching ground by slowly discharging the potential toward ground and terminating the discharge prior to reaching ground, the leakage in memory cell 102b is reduced and consequently, the frequency of the refresh operation may be decreased.

Conventional boosted sense ground scheme circuits use a voltage generator or precharged-capacitors to produce a precise and constant BSG voltage at the sense amplifier because the subthreshold leakage changes exponentially in response to the BSG voltage. In accordance with the present invention, however, a constant BSG voltage is not generated, but is the result of the controlled and slow discharge of the sense amplifier 101 and bit line BL toward ground and ending the active cycle prior to the sense amplifier 101 and bit line BL reaching ground potential. While the amount of subthreshold leakage increases as bit line BL approaches ground, the overall amount of leakage is minimal because the bit line BL is close to ground for only a short period. Moreover, the advantage in power savings of the present invention due to the elimination of a voltage generator or discharge capacitors more than compensates for any increase in subthreshold leakage.

Although the present invention has been described in considerable detail with reference to certain versions thereof, other versions are possible. Some components are shown directly connected to one another while others are shown connected via intermediate components. In each instance, the method of interconnection establishes some desired electrical communication between two or more circuit nodes. Such communication as well as the logic functions of the circuits may often be accomplished using a number of circuit configurations, as will be understood by those of ordinary skill in the art. Therefore, the spirit and scope of the appended claims should not be limited to the description of the versions depicted in the figures.

What is claimed is:

1. A memory circuit comprising:
   a plurality of bit lines;
   a plurality of word lines;
   a plurality of memory cells disposed between said bit lines and said word lines;
   a sense amplifier for reading data from a selected memory cell connected to a selected bit line, said sense amplifier comprising:
   a first transistor disposed between said sense amplifier and ground potential, said first amplifier having a first size, having a gate terminal coupled to a first drive terminal;
   a second transistor disposed between said sense amplifier and ground potential, said second amplifier having a second size, said second size being smaller than said first size, said second transistor having a gate terminal coupled to a second drive terminal.

2. The memory circuit of claim 1, further comprising:
   a control circuit coupled to said first drive terminal and said second drive terminal, said control circuit turning said first transistor and said second transistor on and turning said first transistor off while leaving said second transistor on.

3. The memory circuit of claim 2, wherein:
   said first transistor discharges said sense amplifier towards ground at a faster rate than said second transistor;
   said control circuit turns said first transistor off prior to said sense amplifier reaching ground; and
   said control circuit turning said second transistor off prior to said sense amplifier reaching ground.

4. The memory circuit of claim 1, further comprising:
   a third transistor disposed between said sense amplifier and a power supply.

5. The memory circuit of claim 1, wherein during a first period said first transistor and said second transistor are on and discharge said sense amplifier toward ground at a first rate and during a second period said first transistor is off and said second transistor is on and discharges said sense amplifier at a second rate, said second rate being less than said first rate, and during a third period said first transistor is off and said second transistor if off.

6. The memory circuit of claim 5, wherein said third period starts prior to said sense amplifier being discharged to ground.

7. A method of controlling a memory circuit, said memory circuit including a plurality of word lines, a plurality of bit lines and a plurality of memory cells disposed between said word lines and bit lines, said memory circuit further including at least one sense amplifier coupled to a plurality of bit lines, said method comprising:

discharging at a first rate the potential of a sense amplifier toward ground potential;

discharging at a second rate the potential of said sense amplifier toward ground potential, said first rate being greater than said second rate; and terminating the discharge of the potential of said sense amplifier toward ground potential.

8. The method of claim 7, wherein said terminating the discharge of the potential of said sense amplifier toward ground potential is performed prior to said sense amplifier reaching ground potential.

9. The method of claim 7, wherein:

discharging at a first rate the potential of a sense amplifier toward ground potential comprises electrically coupling said sense amplifier to ground potential through at least a first transistor, and discharging at a second rate the potential of said sense amplifier toward ground potential comprises electrically decoupling said sense amplifier to ground potential through said first transistor and electrically coupling said sense amplifier to ground potential through at least a second transistor having a second size, said second transistor being smaller than said first transistor.

10. The method of claim 9, wherein discharging at a first rate the potential of a sense amplifier toward ground potential comprises electrically coupling said sense amplifier to ground potential through said first transistor and said second transistor.

11. The method of claim 9, wherein terminating the discharge of the potential of said sense amplifier toward ground potential comprises electrically decoupling said sense amplifier to ground potential through said second transistor.

* * * * *